(12) United States Patent
Tangring et al.

(10) Patent No.: US 12,027,645 B2
(45) Date of Patent: Jul. 2, 2024

(54) OPTOELECTRONIC SEMICONDUCTOR CHIP AND METHOD FOR PRODUCING AN OPTOELECTRONIC SEMICONDUCTOR CHIP

(71) Applicant: OSRAM Opto Semiconductors GmbH, Regensburg (DE)

(72) Inventors: Ivar Tangring, Regensburg (DE); Korbinian Perzlmaier, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 469 days.

(21) Appl. No.: 17/288,569

(22) PCT Filed: Oct. 2, 2019

(86) PCT No.: PCT/EP2019/076768
§ 371 (c)(1),
(2) Date: Apr. 26, 2021

(87) PCT Pub. No.: WO2020/088877
PCT Pub. Date: May 7, 2020

(65) Prior Publication Data
US 2021/0399169 A1    Dec. 23, 2021

(30) Foreign Application Priority Data

Oct. 31, 2018    (DE) .......................... 102018127201.4

(51) Int. Cl.
*H01L 33/14*    (2010.01)
*H01L 33/00*    (2010.01)
(Continued)

(52) U.S. Cl.
CPC .......... *H01L 33/14* (2013.01); *H01L 33/0095* (2013.01); *H01L 33/22* (2013.01);
(Continued)

(58) Field of Classification Search
CPC ..... H01L 33/14; H01L 33/0095; H01L 33/22; H01L 33/405; H01L 33/44;
(Continued)

(56) References Cited

U.S. PATENT DOCUMENTS 6,169,296 B1    1/2001    Kamiyama et al.
2003/0195843 A1    10/2003    Matsuda et al.
(Continued)

FOREIGN PATENT DOCUMENTS

CN    1188816 A    7/1998
DE    102015112538 A1    2/2017
(Continued)

OTHER PUBLICATIONS

Notice of Reasons for Refusal issued for the corresponding JP Patent Application No. 2021-523364, dated Nov. 29, 2022, 8 pages (for informational purposes only).
(Continued)

*Primary Examiner* — Kyoung Lee
(74) *Attorney, Agent, or Firm* — VIERING, JENTSCHURA & PARTNER mbB

(57) ABSTRACT

An optoelectronic semiconductor chip may have or include an x-doped region, a y-doped region, an active region arranged between the x-doped region and the y-doped region, and an x-contact region. The x-contact region may be arranged to the side of the x-doped region facing away from the active region. The x-contact region may include at least one first region and at least one second region. The x-contact region may be designed such that, during operation of the optoelectronic semiconductor chip, more charge carriers are
(Continued)

injected into the x-doped region via the second region than via the first region.

19 Claims, 8 Drawing Sheets

(51) Int. Cl.
 *H01L 33/22* (2010.01)
 *H01L 33/40* (2010.01)
 *H01L 33/44* (2010.01)
(52) U.S. Cl.
 CPC ............ *H01L 33/405* (2013.01); *H01L 33/44* (2013.01); *H01L 2933/0016* (2013.01); *H01L 2933/0025* (2013.01)
(58) Field of Classification Search
 CPC ..... H01L 2933/0016; H01L 2933/0025; H01L 33/00; H01L 33/04; H01L 33/38; H01L 33/145; H01L 33/387
 See application file for complete search history.

(56) References Cited

U.S. PATENT DOCUMENTS

| | | | |
|---|---|---|---|
| 2005/0205886 A1 | 9/2005 | Murofushi et al. | |
| 2007/0145391 A1 | 6/2007 | Baik et al. | |
| 2007/0241327 A1 | 10/2007 | Kim et al. | |
| 2009/0008751 A1* | 1/2009 | Illek ................... | H01L 21/7605 257/E21.462 |
| 2011/0012154 A1 | 1/2011 | Okagawa et al. | |
| 2011/0049555 A1 | 3/2011 | Engl et al. | |
| 2011/0198609 A1 | 8/2011 | Huang | |
| 2012/0097918 A1 | 4/2012 | Yu et al. | |
| 2012/0223356 A1 | 9/2012 | Suzuki | |
| 2012/0235204 A1 | 9/2012 | Hodota et al. | |
| 2013/0009196 A1 | 1/2013 | Junko et al. | |
| 2014/0225150 A1 | 8/2014 | Hsiao et al. | |
| 2017/0047481 A1 | 2/2017 | Bonar et al. | |
| 2017/0077353 A1 | 3/2017 | Kim et al. | |
| 2017/0210277 A1 | 7/2017 | Harada et al. | |
| 2018/0198045 A1 | 7/2018 | Perzlmaier et al. | |

FOREIGN PATENT DOCUMENTS

| | | |
|---|---|---|
| EP | 1272947 A2 | 1/2003 |
| EP | 2555255 A2 | 2/2013 |
| EP | 2950355 A1 | 12/2015 |
| EP | 2603936 B1 | 5/2016 |
| JP | H06296041 A | 10/1994 |
| JP | H11135834 A | 5/1999 |
| JP | 2006032665 A | 2/2006 |
| JP | 2007180504 A | 7/2007 |
| JP | 2007284342 A | 11/2007 |
| JP | 2008500710 A | 1/2008 |
| JP | 2008135554 A | 6/2008 |
| JP | 2008227109 A | 9/2008 |
| JP | 2011061036 A | 3/2011 |
| JP | 2011517064 A | 5/2011 |
| JP | 2014096460 A | 5/2014 |
| JP | 2015153827 A | 8/2015 |
| JP | 2017130617 A | 7/2017 |
| KR | 20130007026 A | 1/2013 |
| WO | 2009084325 A1 | 7/2009 |
| WO | 201104078 A1 | 1/2011 |
| WO | 2011071100 A1 | 6/2011 |
| WO | 2011125311 A1 | 10/2011 |
| WO | 2015121665 A1 | 8/2015 |

OTHER PUBLICATIONS

International search report, issued for the corresponding PCT Application No. PCT/EP2019/076768, dated Mar. 23, 2020, 6 pages (For informational purposes only).
Search report issued for the corresponding German Patent Application No. 102018127201.4 dated Jul. 26, 2019, 8 pages (For informational purposes only).
A. Laubsch et al. "High-Power and High-Efficiency InGaN-Based Light Emitters", IEEE Transactions on Electron Devices, dated Jan. 2010, 9 pages, vol. 57, No. 1.
Translation of the Notification of Reason for Refusal (type I office action) issued for the corresponding JP Patent Application No. 2021-523364, dated May 9, 2022, 7 pages (only for informational purposes).
Search Report by Registered Search Organization issued for the corresponding JP Patent Application No. 2021-523364, dated Apr. 7, 2022, 24 pages (only for informational purposes).
German office action issued for the corresponding German patent application No. 11 2019 005 410.4, dated Mar. 22, 2024, 8 pages (for informational purposes only).
Fernandez, J. R. L. [et al.]: Electrical resistivity and band-gap shift of Si-doped GaN and metal-nonmetal transistion in cubic GaN, InN and AlN systems; Journal of Crystal Growth, 2001, pp. 420-427, vol. 231, No. 3, Elsevier Science B. V.
Office action received for corresponding application DE 11 2019 005 410.4, dated May 10, 2024, 6 pages (for informational purposes only).

* cited by examiner

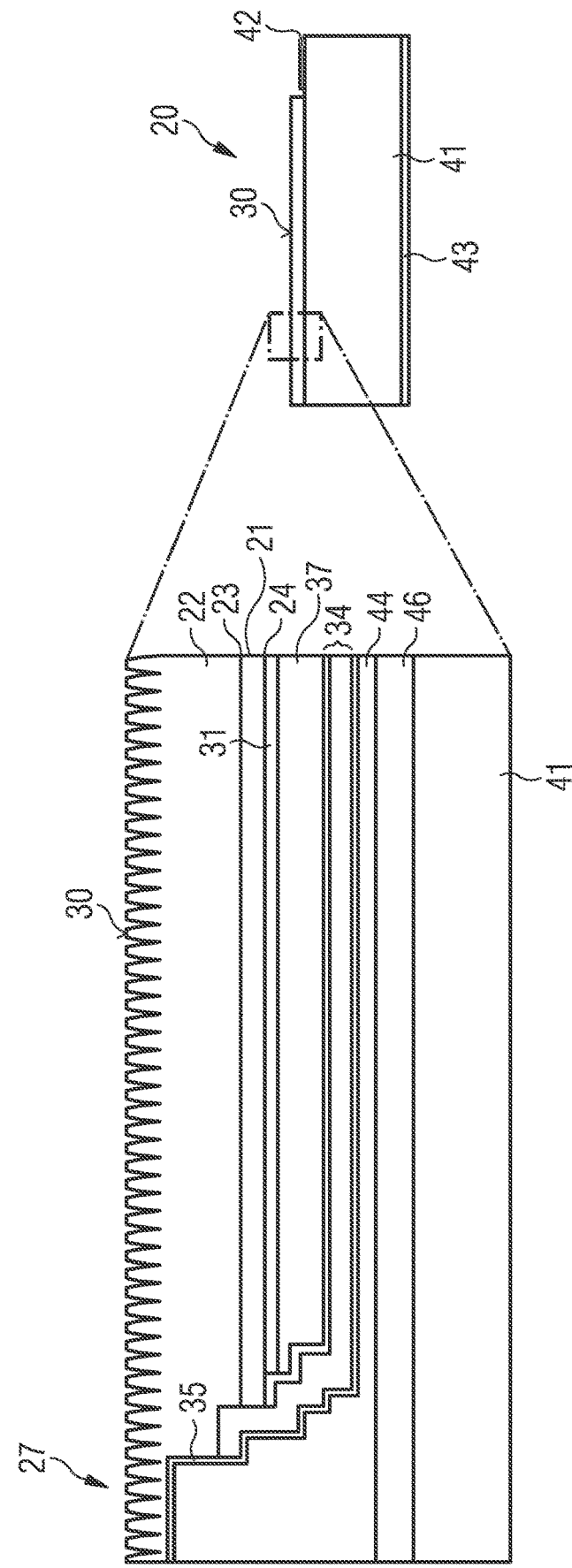

OPTOELECTRONIC SEMICONDUCTOR CHIP AND METHOD FOR PRODUCING AN OPTOELECTRONIC SEMICONDUCTOR CHIP

CROSS-REFERENCE TO RELATED APPLICATIONS

The present application is a national stage entry according to 35 U.S.C. § 371 of PCT Application No. PCT/EP2019/076768 filed on Oct. 2, 2019; which claims priority to German Patent Application Serial No. 10 2018 127 201.4 filed on Oct. 31, 2018; all of which are incorporated herein by reference in their entirety and for all purposes.

TECHNICAL FIELD

An optoelectronic semiconductor chip and a method for producing an optoelectronic semiconductor chip are specified.

BACKGROUND

One problem to be solved is to specify an optoelectronic semiconductor chip that can be operated efficiently. Another problem to be solved is to specify a method for producing an optoelectronic semiconductor chip that can be operated efficiently.

SUMMARY

According to at least one embodiment of the optoelectronic semiconductor chip, the optoelectronic semiconductor chip comprises an x-doped region. The x-doped region is doped with at least one x-dopant. The x-dopant may be a p-type dopant or an n-type dopant. In a non-limiting embodiment, the x-dopant is a p-type dopant. When referring to x or y in the following, these are to be replaced by p or n. The x-doped region may comprise one or more x-doped semiconductor layers. The x-doped region may be formed with a semiconductor material, such as a III-V compound semiconductor material. For example, the x-doped region comprises GaN. The x-doped region may be, at least in places, a three-dimensional body, which comprises, for example, the shape of a cuboid or a cylinder. The main extension plane of the x-doped region runs parallel to one of the top surfaces of the cuboid or the cylinder.

According to at least one embodiment of the optoelectronic semiconductor chip, the optoelectronic semiconductor chip comprises a y-doped region. The y-doped region is doped with at least one y-dopant. The y-dopant may be a p-type dopant or an n-type dopant. In a non-limiting embodiment, the y-dopant is an n-type dopant. The y-doped region may comprise one or more y-doped semiconductor layers. The y-doped region may be formed with a semiconductor material, such as a III-V compound semiconductor material. For example, the y-doped region comprises GaN. The y-doped region may be, at least in places, a three-dimensional body, which comprises, for example, the shape of a cuboid or a cylinder. The main extension plane of the y-doped region is parallel to one of the top surfaces of the cuboid or the cylinder. The y-doped region may be in, in particular direct, contact with an electrically conductive y-contact layer. The y-contact layer may be provided for electrically contacting the y-doped region. Thus, the y-doped region can be electrically contacted via the y-contact layer.

According to at least one embodiment of the optoelectronic semiconductor chip, the optoelectronic semiconductor chip comprises an active region arranged between the x-doped region and the y-doped region. The active region may be designed to emit and/or detect electromagnetic radiation during operation of the optoelectronic semiconductor chip. The active region may comprise at least one quantum well structure.

The semiconductor chip is, for example, a luminescent diode chip such as a light emitting diode chip or a laser diode chip.

According to at least one embodiment of the optoelectronic semiconductor chip, the optoelectronic semiconductor chip comprises an x-contact region. The x-contact region may be one or more layers. The x-contact region may be provided for electrically contacting the x-doped region. The x-contact region may comprise a main extension plane that is parallel to the main extension plane of the x-doped region. The x-contact region may comprise a semiconductor material at least in places. The x-contact region may be at least in places doped with at least one x-dopant.

According to at least one embodiment of the optoelectronic semiconductor chip, the x-contact region is arranged on the side of the x-doped region facing away from the active region. The x-contact region may be in direct contact with the x-doped region. The x-contact region may be arranged between the x-doped region and an x-side contact of the semiconductor optoelectronic chip. The x-side contact may be provided for electrically contacting the x-doped region. Thus, the x-contact region may be designed to make an electrical contact between the x-side contact and the x-doped region. That is, the x-contact region is electrically conductive at least in places. The x-side contact may comprise an electrically conductive material, for example a metal.

An x-contact layer may be arranged between the x-contact region and the x-side contact. The x-contact layer may be provided for electrically contacting the x-doped region. For example, the x-contact layer comprises a metal, for example silver. The x-contact layer may be designed to reflect electromagnetic radiation emitted from the active region. Thus, the outcoupling efficiency of the optoelectronic semiconductor chip can be improved. Furthermore, a metallic x-contact layer can increase the rate of radiative recombination, in particular by exploiting the Purcell effect.

The y-doped region, the active region, the x-doped region and the x-contact region can be arranged on a common carrier. The carrier can be a growth substrate on which semiconductor layers of the optoelectronic semiconductor chip are epitaxially deposited. Alternatively, the carrier may be another mechanically supporting component of the semiconductor chip. In this case, the growth substrate may be thinned or removed.

According to at least one embodiment of the optoelectronic semiconductor chip, the x-contact region comprises at least one first region and at least one second region. The first region and the second region may each be a portion of a layer. It is further possible for the first region and/or the second region to be a layer. The first region and the second region may be directly adjacent to each other. That is, the first region and the second region may be in direct contact. The first region and the second region may differ in material composition.

According to at least one embodiment of the optoelectronic semiconductor chip, the x-contact region is designed to inject more charge carriers into the x-doped region via the second region than via the first region during operation of the optoelectronic semiconductor chip. The x-doped region can be supplied with charge carriers via the x-side contact. The charge carriers are holes in particular. The x-contact region is designed such that, during operation of the optoelectronic semiconductor chip, more charge carriers are injected from the x-side contact through the second region into the x-doped region than through the first region. This can mean that charge carriers provided by the x-side contact can enter the x-doped region through the x-contact layer and the second region. Of the charge carriers that enter the x-doped region during operation of the optoelectronic semiconductor chip, a larger proportion of these charge carriers enter the x-doped region via the second region than via the first region.

According to at least one embodiment of the optoelectronic semiconductor chip, the optoelectronic semiconductor chip comprises an x-doped region, a y-doped region, an active region arranged between the x-doped region and the y-doped region, and an x-contact region, wherein the x-contact region is arranged at the side of the x-doped region facing away from the active region, the x-contact region comprises at least one first region and at least one second region, and the x-contact region is designed such that, during operation of the optoelectronic semiconductor chip, more charge carriers are injected into the x-doped region via the second region than via the first region.

The optoelectronic semiconductor chip described here is based inter alia on the idea that the optoelectronic semiconductor chip can be operated more efficiently if the electric intensity of current is distributed as uniformly as possible in the optoelectronic semiconductor chip during operation. An uneven distribution of the intensity of current can occur between the y-contact layer and the x-side contact if the y-contact layer is not arranged over a large region, but rather at points or locally in the optoelectronic semiconductor chip and the x-side contact is formed over a large region. In particular, this means that if the x-side contact is formed over a large region, holes are made available over the entire extension of the x-side contact for the active region to recombine. Electrons, however, are only made available locally in the y-contact layer region. Therefore, the electrical resistance for the electrons in the y-doped region is lowest near the y-contact layer and increases with distance from the y-contact layer. In addition, the electrical conductivity of the y-doped region is usually much smaller than that of the x-side contact. This uneven distribution of electrical resistance can cause the intensity of current in some regions to be significantly greater than in other regions. However, the efficiency of radiative recombination is greater at low intensities of current than at high intensities of current.

Since more charge carriers are injected into the x-doped region via the second region than via the first region during operation of the optoelectronic semiconductor chip, a more uniform distribution of intensity of current can be achieved in the optoelectronic semiconductor chip, especially in the active region. For example, the contact resistance between the x-side contact and the x-doped region may be greater in the first region than in the second region. This results in more charge carriers being injected into the x-doped region via the second region than via the first region. Overall, the electrical resistance, which is reduced in the y-doped region near the y-contact layer, can thus be compensated by a larger electrical resistance in the x-contact region. Since the x-contact region comprises at least one first region and at least one second region, the active region can be further supplied with charge carriers, in particular with holes, over a large region.

Bringing in the x-contact region, in which the injection of charge carriers varies, i.e. for example the resistance is increased in places, means that overall the electrical resistance between the y-contact layer and the x-side contact is less dependent on the distance to the y-contact layer. Therefore, the intensity of current also comprises more uniform values during operation of the optoelectronic semiconductor chip. The occurrence of increased intensities of current in the vicinity of the y-contact layer or in the active region is thus reduced or avoided. Therefore, the overall homogeneity of the current flowing in the semiconductor chip is advantageously increased. Since the occurrence of locally elevated intensities of current is avoided, the efficiency of radiative recombination and thus the efficiency of the semiconductor optoelectronic chip can be increased. In addition, the optoelectronic semiconductor chip can be operated at a higher current due to the reduction in the maximum intensity of current that occurs. This means that the optoelectronic semiconductor chip can emit light with a greater intensity. Furthermore, the control difference is reduced due to the increased efficiency. Avoiding locally increased intensities of current further leads to an increased lifetime of the optoelectronic semiconductor chip, since local overheating of the optoelectronic semiconductor chip is reduced or avoided.

If the optoelectronic semiconductor chip comprises a plurality of y-contact layers, small differences in electrical resistance between the different y-doped regions, which may occur during manufacturing, can be compensated for via the x-contact region. In addition, differences in electrical resistance that occur due to different heat dissipation can be compensated.

According to at least one embodiment of the optoelectronic semiconductor chip, the first region comprises a first electrical conductivity and the second region comprises a second electrical conductivity, wherein the first electrical conductivity is at most 20 percent of the second electrical conductivity. That is, the second electrical conductivity is greater than the first electrical conductivity. It is further possible that the first electrical conductivity is at most 10 percent of the second electrical conductivity.

The first electrical conductivity and the second electrical conductivity may each refer to an electrical conductivity in a vertical direction. The vertical direction is perpendicular to the main extension plane of the optoelectronic semiconductor chip. In particular, the first and the second electrical conductivities are hole conductivities. That is, the first electrical conductivity may be a first hole conductivity and the second electrical conductivity may be a second hole conductivity. Thus, the electrical resistance is greater in the first region than in the second region. In addition, the contact resistance between the x-side contact and the x-doped region can be affected. Due to the different electrical conductivities of the first and the second regions, more charge carriers are injected into the x-doped region via the second region than via the first region during operation of the optoelectronic semiconductor chip. Thus, a more uniform distribution of the intensity of current in the optoelectronic semiconductor chip can be achieved.

According to at least one embodiment of the optoelectronic semiconductor chip, the first region comprises a first electrical conductivity and the second region comprises a second electrical conductivity, wherein the first electrical conductivity is at least 0.1 percent, in particular at least 1 percent of the second electrical conductivity. This means, the first region is in particular not electrically insulating, but has a certain electrical conductivity which, however, is in particular smaller than the electrical conductivity of the second region.

According to at least one embodiment, the first region and the second region comprise the same material. This may mean that the first region and the second region comprise the same material composition. Further, it is possible that the first region and the second region are formed with the same material. Thus, for example, the first region and the second region differ only in structure. By the first region and the second region comprising the same material, the fabrication of the optoelectronic semiconductor chip is simplified. The first region and the second region may comprise GaN or be formed with GaN.

According to at least one embodiment, the first region and the second region are arranged adjacent to each other in a lateral direction, wherein the lateral direction is parallel to the main extension plane of the optoelectronic semiconductor chip. The first region and the second region may be arranged directly adjacent to each other in the lateral direction. That is, the first region and the second region are arranged contiguously to each other. Since the first region and the second region are arranged adjacent to each other in a lateral direction, the x-side contact region comprises different values of electrical conductivity in the lateral direction. The holes provided by the x-side contact can mainly pass through the second region into the active region. The electric current through the first region during the operation of the optoelectronic semiconductor chip is much lower than the electric current through the second region. By this arrangement, on the one hand, the active region can be supplied with holes and, on the other hand, the electrical resistance of the y-doped region is compensated by the x-contact region. Thus, the optoelectronic semiconductor chip can be operated more efficiently.

The extension of the first region in the lateral direction may be smaller than 1 µm. Further, it is possible that the extension of the first region in the lateral direction is smaller than 500 nm. The extension of the second region in the lateral direction may be less than 1 µm. Further, it is possible that the extension of the second region in the lateral direction is less than 500 nm. The first region and the second region may comprise the same extension in the lateral direction. Alternatively, it is possible that the first region and the second region comprise different extensions in the lateral direction.

In the vertical direction extending perpendicular to the lateral direction, the first region may comprise a thickness of at most 100 nm. Further, the first region may comprise a thickness of at most 10 nm in the vertical direction. The second region may comprise a thickness of at most 100 nm in the vertical direction. Further, the second region may comprise a thickness of at most 10 nm in the vertical direction. The first region and the second region may comprise the same thickness in the vertical direction. Alternatively, it is possible that the first region and the second region comprise a different thickness in the vertical direction.

The electrical resistance of the x-contact region can be adjusted via the extension of the first and the second region in the lateral direction and via the thickness of the first and the second region in the vertical direction. Thus, the electrical resistance of the x-contact region can be adjusted such that it compensates for the electrical resistance of the y-doped region.

According to at least one embodiment, the x-contact region comprises a plurality of first regions and/or a plurality of second regions. For example, the first and the second regions are arranged alternately in the x-contact region. This means that during operation of the optoelectronic semiconductor chip, a larger electric current occurs in the second regions than in the first regions. Since the x-doped region also comprises a certain electrical conductivity, the holes provided by the x-side contact can be distributed in the x-doped region and these are made available to the active region over a large region. The most uniform possible distribution of charge carriers in the x-doped region is achieved by a small lateral extension of the first and the second regions. For this purpose, the first and the second regions comprise an extension of at most 1 µm or at most 500 nm in a lateral direction, for example. With a plurality of first and second regions in the x-contact region, it is ensured on the one hand that holes are brought into the active region over a large region and on the other hand that the electrical resistance in the x-contact region is increased in places to compensate for the reduced electrical resistance in the y-doped region. Thus, the optoelectronic semiconductor chip can be operated more efficiently.

According to at least one embodiment, a penetration extends through the x-doped region and the active region for electrical contacting of the y-doped region. The penetration comprises an electrically conductive material, such as a metal. Further, a y-contact layer may be arranged in the penetration. The y-contact layer comprises an electrically conductive material, such as a metal. The y-contact layer may be in direct contact with the y-doped region. The penetration may extend in the vertical direction through the x-doped region and the active region. Further, the penetration may extend at least in places through the y-doped region. An insulation region may be arranged between the penetration and the x-doped region. The insulation region may comprise an electrically insulating material. For example, the insulation region comprises $Al_2O_3$ and/or $SiO_2$. The insulation region may be further arranged between the active region and the penetration, and at least in places between the y-doped region and the penetration. The cross-section through the penetration in a plane which is parallel to the main extension plane of the optoelectronic semiconductor chip may comprise the shape of a circle. The penetration is used for electrical contacting of the y-doped region.

According to at least one embodiment, the size of the second regions in a lateral direction is greater the further away the second regions are from the penetration, wherein the lateral direction runs parallel to the main extension plane of the optoelectronic semiconductor chip. This means that second regions which are arranged near the penetration comprise a smaller size in the lateral direction than second regions which are arranged further away from the penetration. The size of the second regions in the lateral direction may be an extension or elongation of the second regions in the lateral direction. Thus, the second regions comprise different sizes in the lateral direction, wherein the size of the respective second regions in the lateral direction increases with distance from the penetration. The size of the first regions in the lateral direction may be the same within the manufacturing tolerance. Advantageously, with this arrangement, the lower electrical resistance in the y-doped region near the penetration is compensated by the increased electrical resistance of the first regions. The electrical resistance in the y-doped region increases with distance from the penetration, so less compensation is required by the x-contact region as the distance from the penetration increases.

Advantageously, the size of the compensation can be adjusted by the size of the second regions in the lateral direction.

According to at least one embodiment, the first region comprises a disturbed crystal structure. This may mean that the crystal structure in the first region is polycrystalline. Further, the first region may comprise dislocations or cracks. The material in the first region may be structured. For this purpose, the material in the first region may be treated with a plasma. The plasma treatment alters or disturbs the crystal structure. In particular, the crystal structure is disturbed only in the first region and not in the underlying layers, such as the active region or the y-doped region. The material in the second region is not treated with a plasma. Therefore, the material in the second region may be single crystalline. Further, the material in the second region may comprise a crystal structure that is not disturbed. Since the first region comprises a disturbed crystal structure, the first electrical conductivity is lower than the second electrical conductivity. Thus, the plasma treatment can advantageously change the first electrical conductivity such that the contact resistance between the x-side contact and the x-doped region is higher in the first region than in the second region. As a result, it can be achieved that during operation of the optoelectronic semiconductor chip more charge carriers are injected into the x-doped region than via the second region than via the first region.

According to at least one embodiment, the first region comprises an electrically insulating layer. The electrically insulating layer can extend over the entire extension of the first region. The electrically insulating layer may be a dielectric layer comprising, for example, $SiO_2$. The electrically insulating layer may comprise a thickness of at most 100 nm in the vertical direction. It is further possible that the electrically insulating layer comprises a thickness of at most 10 nm in the vertical direction. Alternatively, the electrically insulating layer may comprise a thickness of at most 2 nm in the vertical direction. The second region may be free of an electrically insulating layer. Since the first region comprises the electrically insulating layer, the electrical resistance in the first region is increased relative to the electrical resistance in the second region. Thus, by bringing in the electrically insulating layer in the first region, it can be achieved that the contact resistance between the x-side contact and the x-doped region is higher in the first region than in the second region. As a result, it can be achieved that during operation of the optoelectronic semiconductor chip more charge carriers are injected into the x-doped region via the second region than via the first region.

According to at least one embodiment, the first region and the second region comprise an electrically conductive layer having a third electrical conductivity, wherein the third electrical conductivity is greater than the electrical conductivity of the y-doped region. The electrically conductive layer may extend throughout the first region and the second region. The electrically conductive layer may be at least partially transparent to electromagnetic radiation generated by the active region. For example, the electrically conductive layer comprises x-doped indium tin oxide (ITO).

The thickness of the electrically conductive layer in the vertical direction may be adapted to the electrical conductivity of the y-doped region. That is, the thickness of the electrically conductive layer in the vertical direction is adjusted such that the electrical conductivity of the electrically conductive layer matches the electrical conductivity of the y-doped region. For example, if the third electrical conductivity is ten times the electrical conductivity of the y-doped region, the thickness of the electrically conductive layer in the vertical direction is 10% of the thickness of the y-doped region in the vertical direction.

The extension of the first region in the lateral direction may be greater than 10 μm. Alternatively or additionally, the extension of the second region in the lateral direction may be greater than 10 μm. The first region and the second region may comprise different extensions in the lateral direction.

The first region additionally comprises an electrically insulating layer. In this case, the electrically conductive layer is arranged between the electrically insulating layer and the x-doped region. The electrically insulating layer may comprise a dielectric material such as $SiO_2$. The thickness of the electrically insulating layer in the vertical direction may be at most 50 nm or at most 10 nm. The electrically insulating layer is arranged between the x-doped region and the x-side contact. However, the charge carriers provided by the x-side contact can only enter the electrically conductive layer via the second region. This makes it possible to ensure that more charge carriers are injected into the x-doped region via the second region than via the first region during operation of the optoelectronic semiconductor chip. Since the electrically conductive layer extends over the entire first and second region, the charge carriers can be distributed throughout the electrically conductive layer and reach the x-doped region over a large region. Since the electrically conductive layer comprises a larger electrical conductivity than the x-doped region, it is advantageous that the holes are distributed in the electrically conductive layer instead of in the x-doped region. Thus, bringing in the electrically conductive layer ensures that the holes provided by the x-side contact reach the active region over a large region. Therefore, locally increased intensities of current are avoided and radiative recombination is more efficient.

According to at least one embodiment, a radiation exit side of the optoelectronic semiconductor chip is arranged on the side of the y-doped region facing away from the active region. The radiation exit side is the side of the optoelectronic semiconductor chip where a majority of the electromagnetic radiation emitted by the active region during operation exits. At the radiation exit side, the optoelectronic semiconductor chip may comprise a roughened or structured surface. For example, the surface may be patterned by etching, dry chemical processes, mechanical processes, or by plasma treatment. A roughened surface on the radiation exit side can increase the outcoupling efficiency of electromagnetic radiation emitted from active region during operation.

A method for producing an optoelectronic semiconductor chip is further specified. The optoelectronic semiconductor chip is producable by a method described herein. In other words, all features disclosed for the optoelectronic semiconductor chip are also disclosed for the method for producing an optoelectronic semiconductor chip, and vice versa.

According to at least one embodiment of the method for producing an optoelectronic semiconductor chip, the method comprises a method step of depositing an x-doped region on a y-doped region for forming an active region between the x-doped region and the y-doped region. The y-doped region may be grown on a substrate. The substrate may comprise sapphire. The x-doped region and the y-doped region may comprise GaN.

According to at least one embodiment of the method for producing an optoelectronic semiconductor chip, the method comprises a method step of applying an x-contact region to the x-doped region. The x-contact region may be formed on the x-doped region in one or more steps. The x-contact region may be applied directly to the x-doped region.

According to at least one embodiment of the method, the x-contact region comprises at least one first region and at least one second region. The first region and the second region may be formed sequentially.

According to at least one embodiment of the method, the x-contact region is designed to inject more charge carriers into the x-doped region via the second region than via the first region during operation of the optoelectronic semiconductor chip.

The method described herein is based, inter alia, on the idea that a more uniform distribution of the intensity of current in the optoelectronic semiconductor chip can be achieved because more charge carriers are injected into the x-doped region via the second region than via the first region during operation of the optoelectronic semiconductor chip. To achieve this, for example, the electrical resistance between the y-contact layer and the x-side contact is changed by bringing in the x-contact region. For example, the first region in the x-contact region is formed such that it comprises a greater electrical resistance than the second region. Thus, the overall electrical resistance, which is reduced in the y-doped region near the y-contact layer, can be compensated by a larger electrical resistance in the x-contact region. As a result, the optoelectronic semiconductor chip can be operated more efficiently.

According to at least one embodiment of the method, the first region is treated with a plasma. For this purpose, a photoresist is applied to the x-doped region in places. In the region or regions where no photoresist is applied, the x-doped region is treated with a plasma. The plasma may be an argon plasma. The plasma treatment disturbs the crystal structure on the surface of the x-doped region. As a result, the first region is formed. The first region comprises the region in which the crystal structure is disturbed. The regions or the region which is arranged in the lateral direction adjacent to the first region is the second region or the second regions. In the second region, the crystal structure is not disturbed. Advantageously, in this way the electrical resistance can be increased in the first region compared to the second region without the need for any further material. Thus, it can be achieved that during operation of the optoelectronic semiconductor chip more charge carriers are injected into the x-doped region via the second region than via the first region. Furthermore, the overall extension of the optoelectronic semiconductor chip in the vertical direction may be unchanged.

According to at least one embodiment of the method, an electrically insulating layer is applied to the x-doped region in the first region. That is, the first region is formed by applying the electrically insulating layer in places to the x-doped region. The electrically insulating layer can be patterned by etching or photolithography such that it is arranged in the first region on the x-doped region. The electrically insulating layer may extend over the entire extension of the first region. The electrically insulating layer may be a dielectric layer comprising, for example, $SiO_2$. The electrically insulating layer may comprise a thickness of at most 100 nm in the vertical direction. It is further possible that the electrically insulating layer comprises a thickness of at most 10 nm in the vertical direction. Alternatively, the electrically insulating layer may comprise a thickness of at most 2 nm in the vertical direction. The second region may be free of an electrically insulating layer. Since the first region comprises the electrically insulating layer, the electrical resistance in the first region is increased relative to the second region. Thus, by bringing in the electrically insulating layer in the first region, it can be achieved that the contact resistance between the x-side contact and the x-doped region is higher in the first region than in the second region. As a result, it can be achieved that more charge carriers are injected into the x-doped region via the second region than via the first region during operation of the optoelectronic semiconductor chip.

According to at least one embodiment of the method, an electrically conductive x-contact layer is applied to the first and the second region. The x-contact layer may comprise a metal, for example silver. The x-contact layer may be designed to reflect electromagnetic radiation emitted from the active region towards the radiation exit side. Furthermore, a metallic x-contact layer may increase the rate of radiative recombination (Purcell effect).

According to at least one embodiment of the method, an electrically conductive x-contact layer is applied to the x-doped region before the x-contact region is applied. This means that the x-contact region is arranged between the x-contact layer and the x-side contact. In case the x-contact region is not transparent to the electromagnetic radiation emitted by the active region, it is advantageous to arrange the x-contact layer between the x-doped region and the x-contact region.

According to at least one embodiment of the method, an electrically conductive layer is applied to the x-contact layer in the first region and then a diffusion layer is applied to the electrically conductive layer and the x-contact layer, wherein the diffusion layer comprises an oxide. The electrically conductive layer may comprise a metal, for example titanium. The electrically conductive layer can be applied directly to the x-contact layer in the first region. In this case, the x-contact layer is arranged on the x-doped region. The diffusion layer is applied to the first and to the second region. For example, the diffusion layer comprises ZnO. After the diffusion layer is applied, the optoelectronic semiconductor chip can be heated to an elevated temperature. For example, the optoelectronic semiconductor chip is heated to a temperature of at least 200° C. and at most 450° C. In the second region, this allows oxygen to diffuse from the diffusion layer into the x-contact layer. Thus, the contact resistance to the x-doped region is reduced. In the first region, the diffusion of oxygen from the diffusion layer into the x-contact layer is reduced or prevented by the electrically conductive layer. Therefore, the second region comprises a larger electrical conductivity than the first region and the contact resistance to the x-doped region is higher in the first region than in the second region. Due to the increased contact resistance in the first region, it can be achieved that during operation of the optoelectronic semiconductor chip more charge carriers are injected into the x-doped region via the second region than via the first region.

According to at least one embodiment of the method, the diffusion layer is removed and a cover layer is applied to the electrically conductive layer and the x-contact layer. The cover layer may be used in place of the diffusion layer to improve contact resistance. The cover layer may comprise nickel. Alternatively, the electrically conductive layer can also be removed before applying the cover layer.

BRIEF DESCRIPTION OF THE DRAWINGS

In the following, the optoelectronic semiconductor chip described herein and the method for producing an optoelectronic semiconductor chip described herein are explained in more detail in connection with non-limiting embodiments and the associated figures.

Figure 3A:
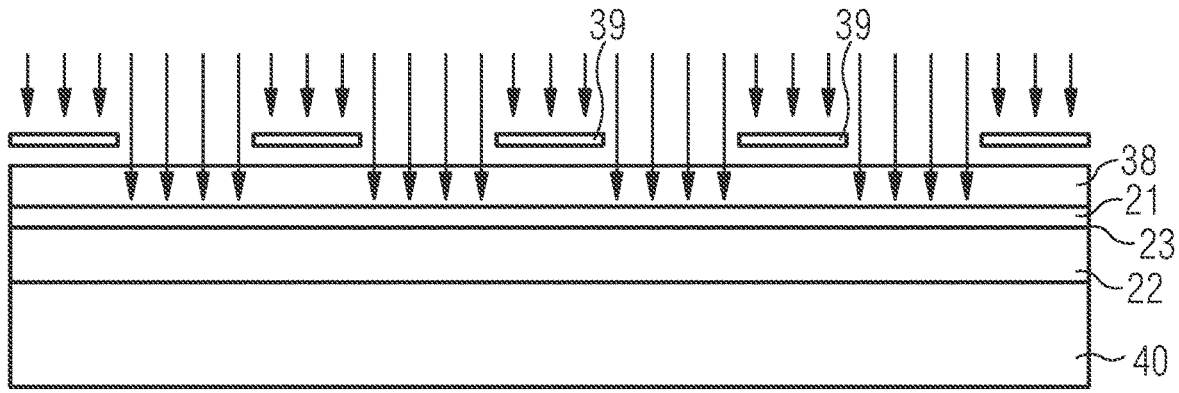
Figure 3B:
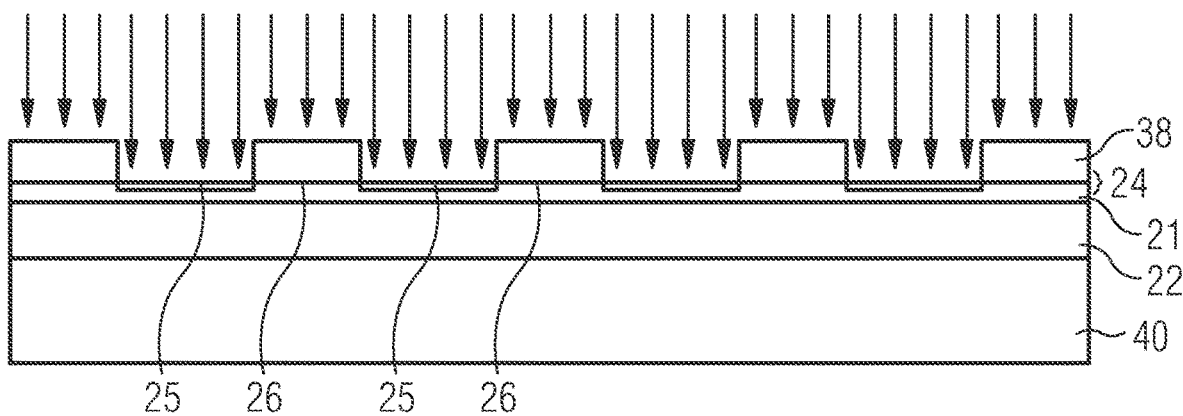
Figure 3C:
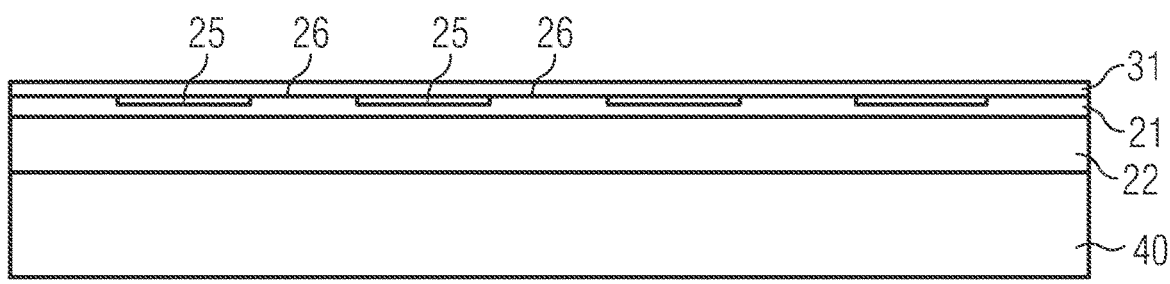

In connection with the FIGS. 3A, 3B and 3C, an exemplary embodiment of the method for producing an optoelectronic semiconductor chip is described.

Figure 4A:
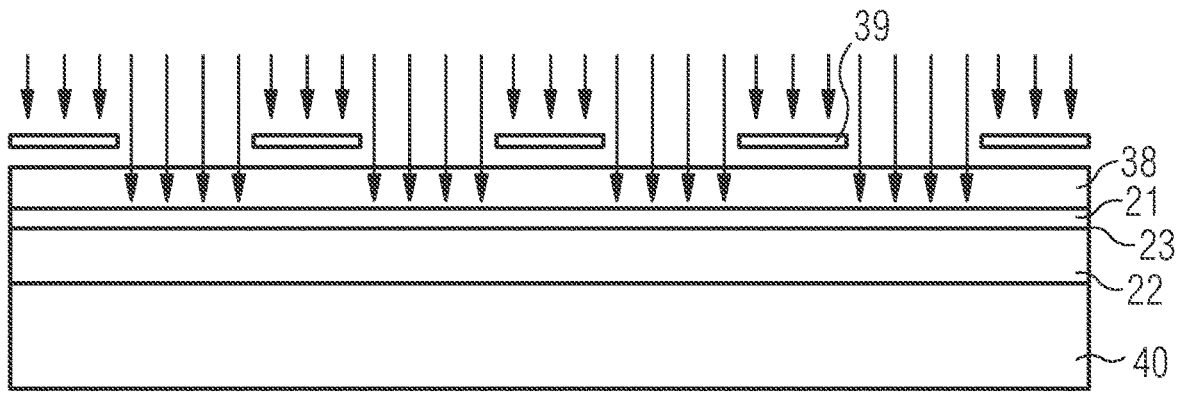
Figure 4B:
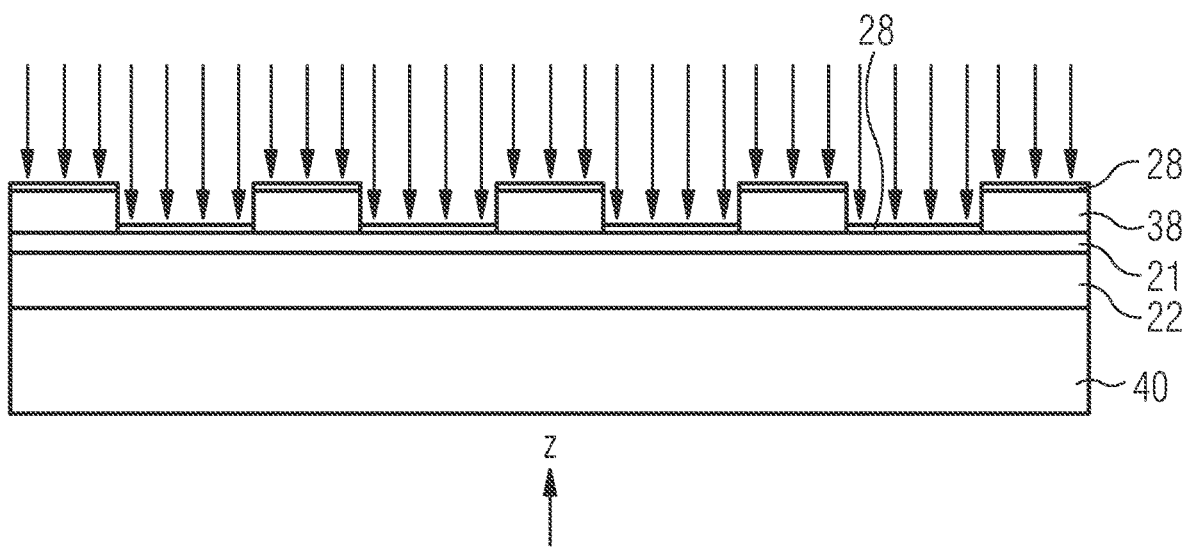
Figure 4C:
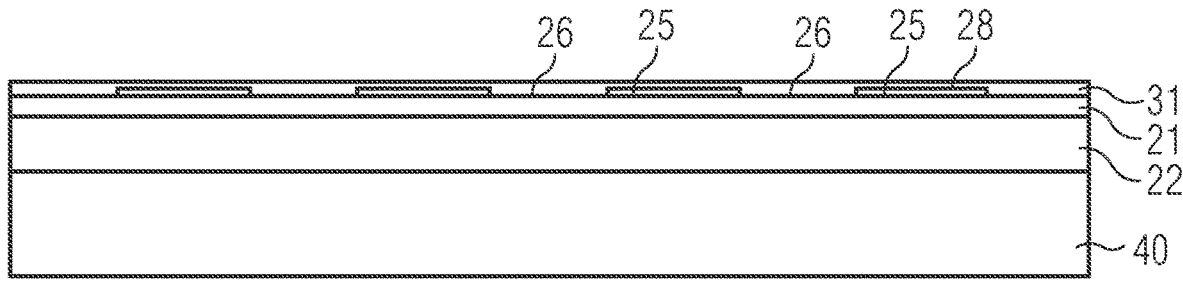

In connection with the FIGS. 4A, 4B and 4C, another exemplary embodiment of the method for producing an optoelectronic semiconductor chip is described.

In connection with the FIGS. 5A, 5B, 5C, 5D and 5E, further exemplary embodiments of the method for producing an optoelectronic semiconductor chip are shown.

Figure 6:
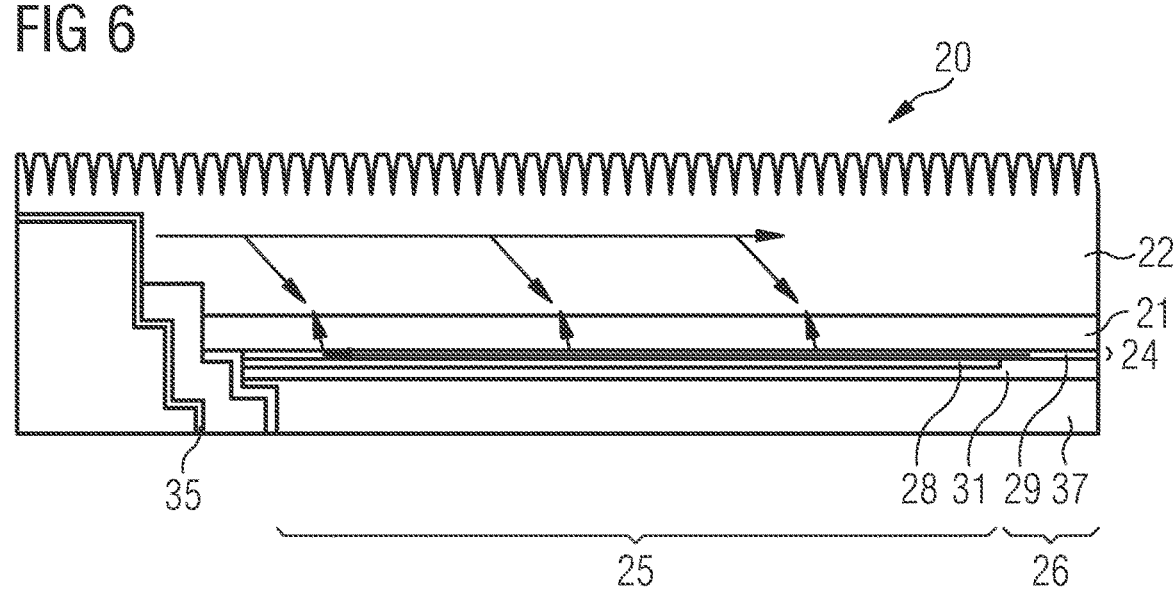

FIG. 6 shows a schematic cross-section through an optoelectronic semiconductor chip according to a further exemplary embodiment.

Figure 7A:
Figure 7B:
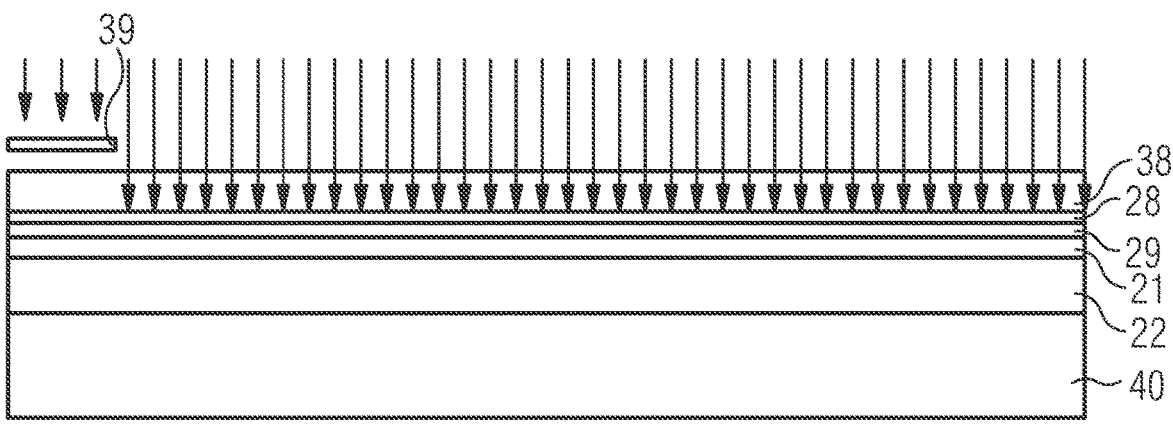
Figure 7C:
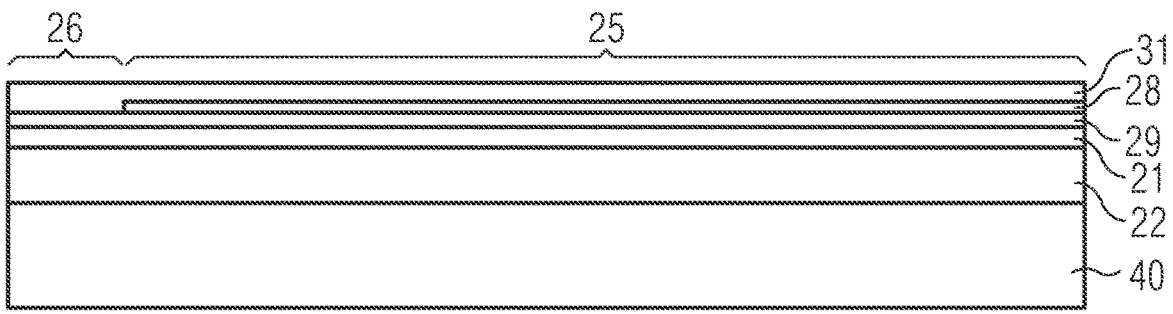

In connection with the FIGS. 7A, 7B and 7C, another exemplary embodiment of the method for producing an optoelectronic semiconductor chip is described.

Figure 8A:
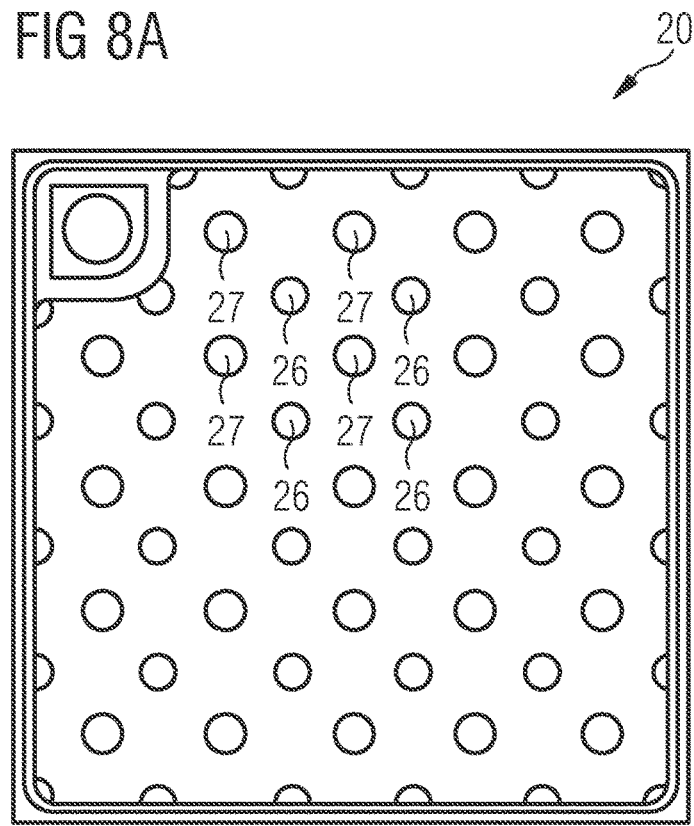
Figure 8B:
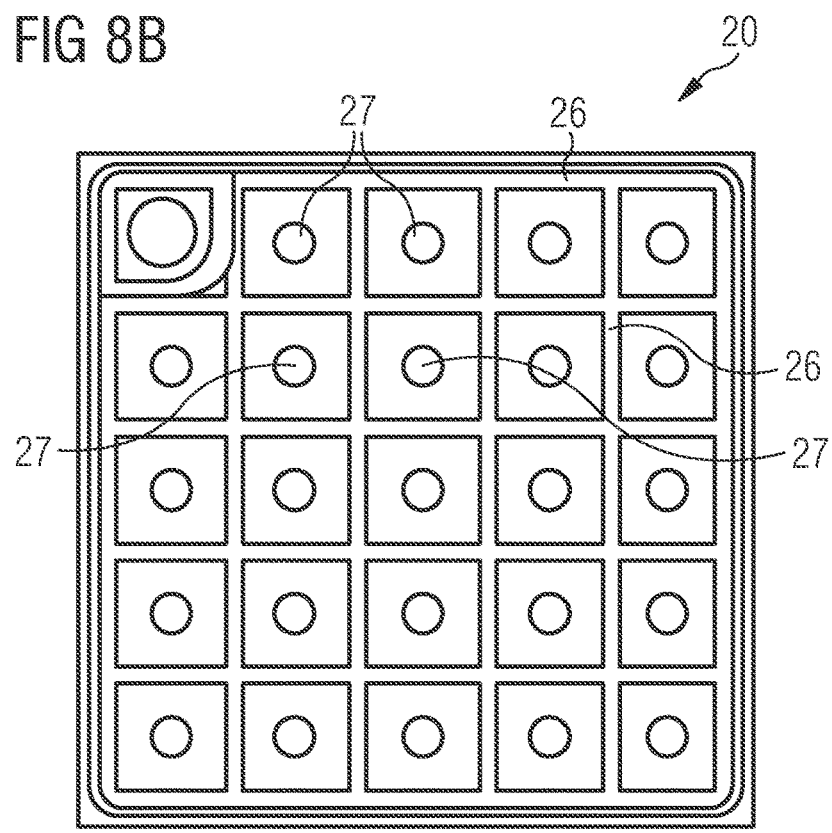

In the FIGS. 8A and 8B, top views of exemplary embodiments of the optoelectronic semiconductor chip are shown.

FIG. 9 shows a schematic cross-section through an optoelectronic semiconductor chip according to a further exemplary embodiment.

Elements that are identical, of the same type or have the same effect are given the same reference signs in the figures. The figures and the proportions of the elements shown in the figures with respect to one another are not to be regarded as to scale. Rather, individual elements may be shown exaggeratedly large for better representability and/or for better comprehensibility.

DETAILED DESCRIPTION

Figure 1:
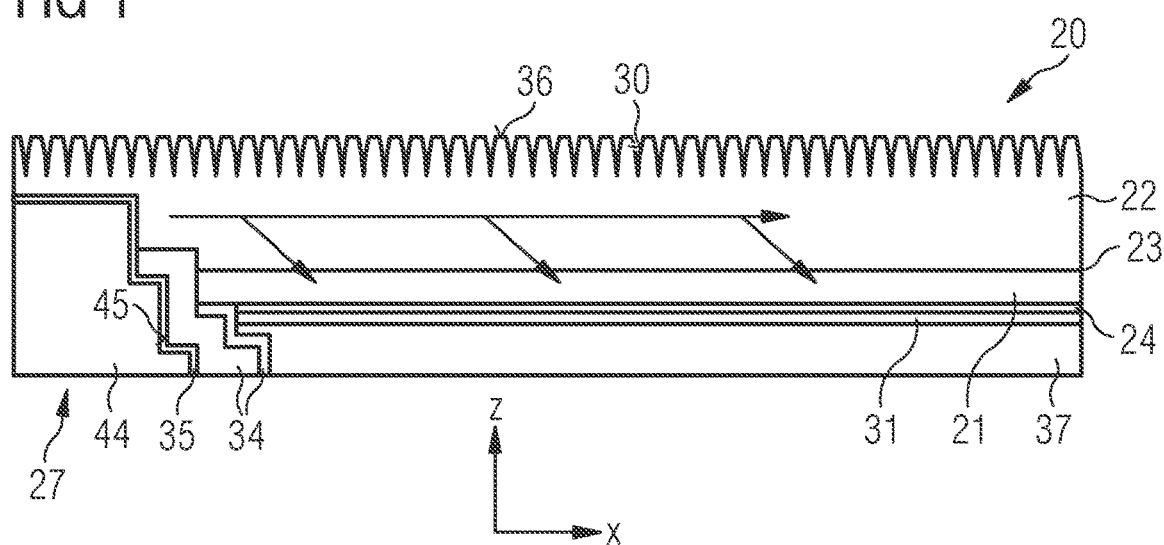
FIG. 1 shows a schematic cross-section through an optoelectronic semiconductor chip according to an exemplary embodiment.

FIG. 1 shows a schematic cross-section of an optoelectronic semiconductor chip 20 according to an exemplary embodiment. The optoelectronic semiconductor chip 20 comprises a y-doped region 22. The y-doped region 22 comprises a patterned surface 36. By patterning the surface 36, the outcoupling efficiency for electromagnetic radiation emitted from the optoelectronic semiconductor chip 20 is improved. The y-doped region 22 is arranged on an x-doped region 21, so that an active region 23 is formed between the y-doped region 22 and the x-doped region 21. The active region 23 is designed to emit electromagnetic radiation during operation of the optoelectronic semiconductor chip 20. A radiation exit side 30 of the optoelectronic semiconductor chip 20 is arranged on the side of the y-doped region 22 facing away from the active region 23.

The x-doped region 21 is arranged on an x-contact region 24. Thus, the x-contact region 24 is arranged on the side of the x-doped region 21 facing away from the active region 23. The x-contact region 24 comprises at least one first region 25 having a first electrical conductivity and at least one second region 26 having a second electrical conductivity. The first and second regions 25, 26 are not shown in FIG. 1.

The x-contact region 24 is arranged on an x-contact layer 31. The x-contact layer 31 comprises silver. Thus, the x-contact layer 31 is designed to reflect electromagnetic radiation emitted from the active region 23 toward the radiation exit side 30. The x-contact layer 31 is arranged on an x-side contact 37. The x-side contact 37 comprises a metal.

The x-contact region 24 comprises a main extension plane. A lateral direction x runs parallel to the main extension plane of the x-contact region 24. The x-contact region 24 is in direct contact with the x-doped region 21 in the lateral direction x over the entire extension of the x-contact region 24. The x-contact layer 31 is in direct contact with the x-contact region 24 and with the x-side contact 37 in the lateral direction x over the entire extension of the x-contact layer 31. The x-side contact 37 is designed to make electrical contact with the x-doped region 21.

For electrical contacting of the y-doped region 22, a penetration 27 extends through the x-doped region 21 and through the active region 23. In addition, the penetration 27 extends in places through the y-doped region 22. The penetration 27 extends in a vertical direction z, which is perpendicular to the main extension plane of the x-doped region 21. An electrically conductive material 44 is arranged in the penetration 27. The electrically conductive material 44 may be a metal. Furthermore, a y-contact layer 35 is arranged in the penetration 27. The y-contact layer 35 is applied to side walls 45 of the penetration 27. The penetration 27 is completely filled with the y-contact layer 35 and the electrically conductive material 44. The y-contact layer 35 is in direct contact with the electrically conductive material 44. To electrically insulate the penetration 27 from the other layers of the optoelectronic semiconductor chip 20, an insulation region 34 is arranged between the penetration 27 and the x-doped region 21. Further, the insulation region 34 is arranged between the penetration 27 and the x-contact region 24, between the penetration 27 and the x-contact layer 31, and between the penetration 27 and the x-side contact 37. The insulation region 34 comprises an electrically insulating material.

Charge carriers, which are made available to the y-doped region 22 via the y-contact layer 35, can reach the active region 23 over the entire lateral extension of the y-doped region 22. Thereby, the electrical resistance increases with the distance to the y-contact layer 35. The movement of the charge carriers is shown with arrows in FIG. 1.

Figure 2:
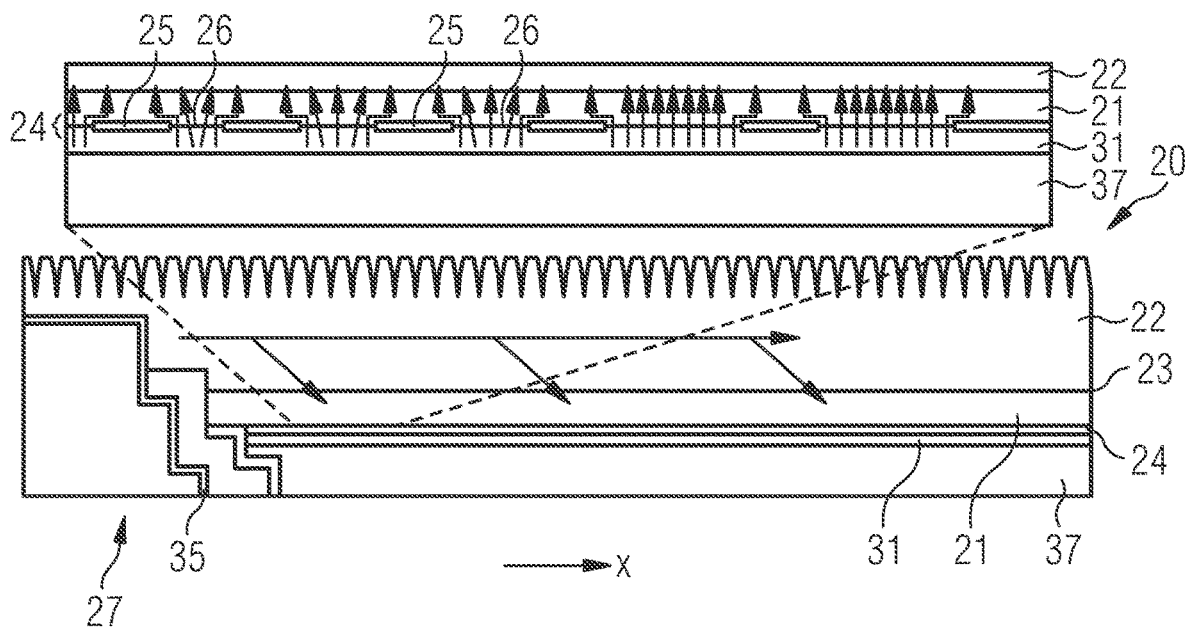
FIG. 2 shows a schematic cross-section through an optoelectronic semiconductor chip according to a further exemplary embodiment.

In FIG. 2 a schematic cross-section through a further exemplary embodiment of the optoelectronic semiconductor chip 20 is shown. The optoelectronic semiconductor chip 20 comprises the structure shown in FIG. 1. Also, a portion of the x-contact region 24 is shown enlarged. In the enlarged portion, it is shown that the x-contact region 24 is arranged on the x-contact layer 31. The x-contact region 24 comprises a plurality of first regions 25 and a plurality of second regions 26. In this regard, the first regions 25 and the second regions 26 are arranged adjacent in the lateral direction x. The x-contact region 24 is designed to inject more charge carriers into the x-doped region 21 via the second region 26 than via the first region 25 during operation of the optoelectronic semiconductor chip 20. For this purpose, the first electrical conductivity may be at most 20% of the second electrical conductivity. Therefore, charge carriers provided by the x-side contact 37 mainly enter the x-doped region 21 through the first regions 25. The movement of the charge carriers through the first regions 25 is shown with arrows in FIG. 2. The charge carriers provided by the x-side contact 37 are holes.

The size of the second regions 26 in the lateral direction x is larger the further away the second regions 26 are from the penetration 27. In this way, the electrical resistance between the y-contact layer 35 and the x-side contact 37 is increased in the vicinity of the penetration 27. At greater distances from the penetration 27, the electrical resistance in the y-doped region 22 is also greater, so that only a small increase in electrical resistance is required in the x-contact region 24, and the second regions 26 can comprise a greater extension in the lateral x direction. By this structure, the current flow in the optoelectronic semiconductor chip 20 is specifically influenced in such a way that no large differences in the intensity of current occur in the active region 23. As a result, the optoelectronic semiconductor chip 20 can be operated more efficiently.

In connection with FIGS. 3A, 3B and 3C, an exemplary embodiment of the method for producing the optoelectronic semiconductor chip 20 is described.

In a first step of the method, as shown in FIG. 3A, the y-doped region 22 is applied to a substrate 40. The substrate 40 comprises sapphire. The x-doped region 21 is applied to the y-doped region 22 to form the active region 23. A photoresist 38 is applied to the x-doped region 21. A mask 39 is applied to the photoresist 38 in places. The mask 39 comprises recesses so that a plurality of regions on the photoresist 38 are covered by the mask 39 and a plurality of other regions on the photoresist 38 are not covered by the mask 39. Then, the photoresist 38 is irradiated with UV radiation. Thus, the surface of the x-doped region 21 is patterned by photolithography. Optionally, before the photoresist 38 is applied, a dielectric layer is applied to the x-doped region 21, which is not shown. The dielectric layer acts as a protective layer.

In FIG. 3B, it is shown that in a next step, the photoresist 38 is removed from the x-doped area 21 in the regions where no mask 39 is arranged. Subsequently, the entire surface, thus the x-doped area 21 and the photoresist 38, is treated with a plasma. The plasma is, for example, an argon plasma. In this process, the x-doped region 21 is damaged by the plasma in the regions where no photoresist 38 is arranged, so that a plurality of first regions 25 are formed. The material of the first regions 25 comprises a disordered crystal structure. In the regions where the mask 39 is arranged, second regions 26 are formed where the crystal structure is not disturbed. Thus, the x-contact region 24 is formed on the x-doped region 21. The first and second regions 25, 26 comprise the same material. If a dielectric layer is arranged on the x-doped region 21, it is removed by wet chemical means in the regions where no mask 39 is arranged. After treatment with the plasma, the remaining photoresist 38 is removed, for example with an O2 plasma. Subsequently, the dielectric layer is removed. Thus, the photoresist 38 can be efficiently removed with a plasma without damaging the second regions 26, since they are protected by the dielectric layer.

In FIG. 3C, it is shown that in a next step, the photoresist 38 is removed. Then, the x-contact layer 31 is applied to the first regions 25 and the second regions 26. Since the first regions 25 comprise a disturbed crystal structure, the first electrical conductivity is lower than the second electrical conductivity. Thus, it can be achieved that more charge carriers are injected into the x-doped region 21 via the second region 26 than via the first region 25 during operation of the optoelectronic semiconductor chip 20.

In connection with FIGS. 4A, 4B and 4C, another exemplary embodiment of the method for producing an optoelectronic semiconductor chip 20 is described.

The method step shown in FIG. 4A corresponds to the step shown in FIG. 3A.

In FIG. 4B, it is shown that in a next step of the method, an electrically insulating layer 28 is applied to the x-doped region 21 and the photoresist 38. The electrically insulating layer 28 comprises $SiO_2$. The thickness of the electrically insulating layer 28 in the vertical direction z is at most 2 nm.

In a next step, as shown in FIG. 4C, the photoresist 38 is removed. The regions in which the electrically insulating layer 28 is arranged form the first regions 25. The regions in which the electrically insulating layer 28 is not arranged form the second regions 26. The x-contact layer 31 is applied to the first regions 25 and the second regions 26. Since the first regions 25 comprise the electrically insulating layer 28, the electrical resistance in the first regions 25 is increased relative to the electrical resistance in the second regions 26. Thus, it can be achieved that more charge carriers are injected into the x-doped region 21 via the second region 26 than via the first region 25 during operation of the optoelectronic semiconductor chip 20.

In connection with the FIGS. 5A, 5B, 5C, 5D and 5E, further exemplary embodiments of the method for producing an optoelectronic semiconductor chip 20 are shown.

Figure 5A:
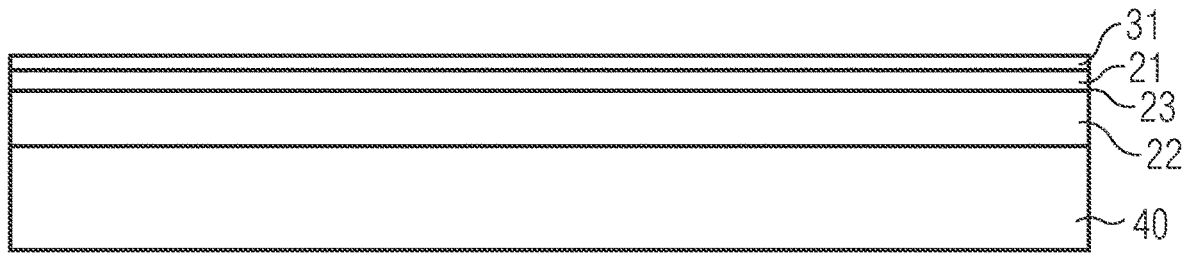

In FIG. 5A, it is shown that in a first step, according to an exemplary embodiment of the method, the y-doped region 22 is applied to the substrate 40. To form the active region 23, the x-doped region 21 is applied to the y-doped region 22. The x-contact layer 31 is applied to the x-doped region 21.

Figure 5B:
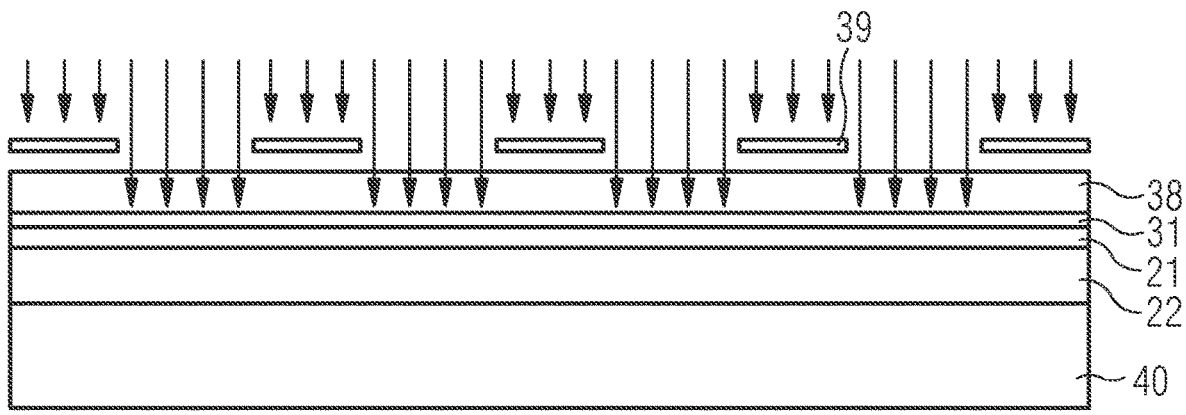

In a next step, as shown in FIG. 5B, a photoresist 38 is applied to the x-contact layer 31. A mask 39 is applied to the photoresist 38 in places. In this step, the mask 39 is applied to the photoresist 38 as described in connection with FIG. 3C. Subsequently, the photoresist 38 is irradiated with UV radiation. In the regions where no mask 39 is arranged, the photoresist 38 is removed from the x-contact layer 31. In addition, the mask 39 is removed. An electrically conductive layer 29 is then applied to the x-contact layer 31 and the photoresist 38. The electrically conductive layer 29 comprises titanium. In a next step, the photoresist 38 is removed.

Figure 5C:
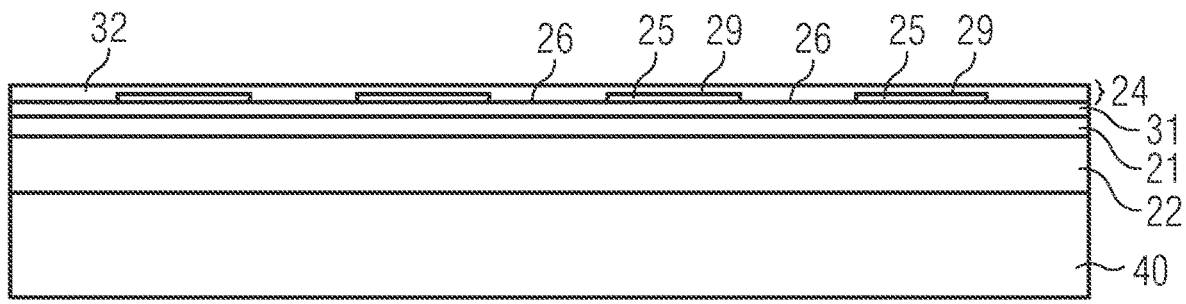

In FIG. 5C, it is shown that the regions in which the electrically conductive layer 29 is arranged on the x-contact layer 31 form the first regions 25. The regions in which the electrically conductive layer 29 is not arranged on the x-contact layer 31 form the second regions 26. A diffusion layer 32 is applied to the first regions 25 and the second regions 26 to form the x-contact region 24. The diffusion layer 32 comprises ZnO. In a next step, the structure is heated to a temperature of at least 200° C. and at most 450° C. Then, oxygen can diffuse from the diffusion layer 32 into the x-contact layer 31 through the second regions 26, thereby lowering the contact resistance. Alternatively or additionally, oxygen may be present or added in the environment. Much less or no oxygen can diffuse from the diffusion layer 32 into the x-contact layer 31 through the first regions 25. Thus, the contact resistance is greater in the first regions 25 than in the second regions 26. Therefore, this method can be used to produce an optoelectronic semiconductor chip 20 having first regions 25 and second regions 26, wherein, during operation of the optoelectronic semiconductor chip 20, more charge carriers are injected into the x-doped region 21 via the second region 26 than via the first region 25.

Figure 5D:
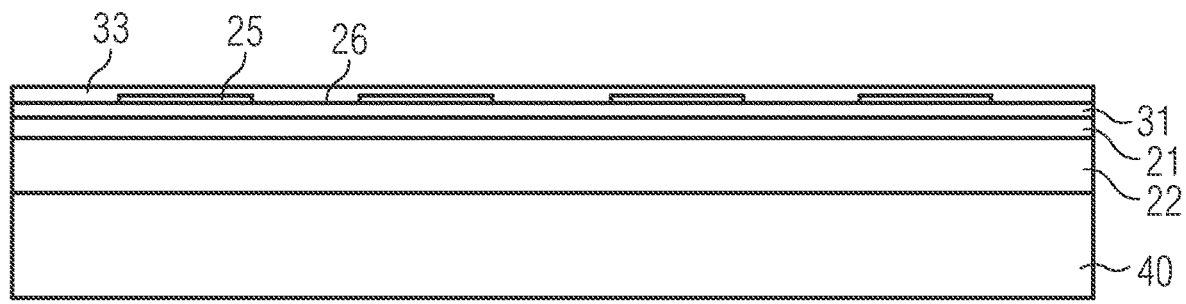

FIG. 5D shows an alternative method step to the step shown in FIG. 5C. Here, the diffusion layer 32 is removed again after diffusion of oxygen into the x-contact layer 31. A cover layer 33 is then applied to the first regions 25 and the second regions 26. The cover layer 33 may comprise nickel.

Figure 5E:

FIG. 5E shows another alternative method step to the step shown in FIG. 5C. In this step, both the diffusion layer 32 and the electrically conductive layer 29 are removed. The cover layer 33 is then applied to the first regions 25 and the second regions 26. In this case, the first regions 25 differ from the second regions 26 in their oxygen concentration. The second regions 26 comprise a greater oxygen concentration and thus a lower electrical resistance.

In FIG. 6, a schematic cross-sectional view of another exemplary embodiment of the semiconductor optoelectronic chip 20 is shown. The exemplary embodiment shown in FIG. 6 differs from the exemplary embodiment shown in FIG. 2 in the structure of the x-contact region 24. The x-contact region 24 comprises a first region 25 and a second region 26. The first region 25 and the second region 26 comprise an electrically conductive layer 29. The electrically conductive layer 29 extends along the entire lateral extension of the first region 25 and the second region 26. The electrically conductive layer 29 comprises x-doped indium tin oxide (ITO). Further, the electrically conductive layer 29 comprises a third electrical conductivity that is greater than the electrical conductivity of the y-doped region 22. The thickness of the electrically conductive layer 29 in the vertical direction z may be adapted to the electrical conductivity of the y-doped region 22. Overall, the electrically conductive layer 29 comprises a smaller thickness in the vertical direction z than the y-doped region 22.

The first region 25 additionally comprises an electrically insulating layer 28. The electrically insulating layer 28 extends over the entire lateral extension of the first region 25. Further, the electrically insulating layer 28 comprises $SiO_2$. The charge carriers provided by the x-side contact 37 enter the electrically conductive layer 29 mainly through the second region 26. This makes it possible to achieve that during operation of the optoelectronic semiconductor chip 20 more charge carriers are injected into the x-doped region 21 via the second region 26 than via the first region 25. In the electrically conductive layer 29, the holes can be distributed over the entire lateral extension thereof due to the high electrical conductivity of the electrically conductive layer 29. The charge carriers enter the x-doped region 21 via the electrically conductive layer 29. Since the electrical resistance between the y-contact layer 35 and the x-side contact 37 is thus increased in the vicinity of the y-contact layer 35, the charge carriers are uniformly distributed in the y-doped region 22 during operation of the optoelectronic semiconductor chip 20. The movement of the charge carriers is shown by arrows in FIG. 6.

In connection with the FIGS. 7A, 7B and 7C, another exemplary embodiment of the method for producing an optoelectronic semiconductor chip 20 is described. The method shown in FIGS. 7A, 7B and 7C can be used to produce the exemplary embodiment shown in FIG. 6.

In FIG. 7A, it is shown that the y-doped region 22, the active region 23 and the x-doped region 21 are arranged on the substrate 40. The electrically conductive layer 29 is applied to the x-doped region 21. The electrically insulating layer 28 is applied to the electrically conductive layer 29.

In a next step, as shown in FIG. 7B, a photoresist 38 is applied to the electrically insulating layer 28. A mask 39 is applied to the photoresist 38 in places. The photoresist 38 is then irradiated with UV radiation.

In FIG. 7C, it is shown that the electrically insulating layer 28 is then removed in the area where the mask 39 is arranged. Thus, the second region 26 is formed in the area where the electrically insulating layer 28 is removed. The first region 25 is formed in the region where both the electrically insulating layer 28 and the electrically conductive layer 29 are arranged on the x-doped region 21. Then, the x-contact layer 31 is applied to the first region 25 and the second region 26. Thus, the charge carriers provided by the x-side contact 37 mainly enter the electrically conductive layer 29 through the second region 26. This allows more charge carriers to be injected into the x-doped region 21 via the second region 26 than via the first region 25 during operation of the optoelectronic semiconductor chip 20.

In FIG. 8A, a top view of an exemplary embodiment of the optoelectronic semiconductor chip 20 is shown. The exemplary embodiment shown in FIG. 8A is the exemplary embodiment shown in FIG. 6. A plurality of penetrations 27 for electrically contacting the y-doped region 22 are uniformly distributed in the optoelectronic semiconductor chip 20. In this regard, the penetrations 27 are arranged at nodes of a square lattice. The penetrations 27 comprise a circular cross section in top view. Further, a plurality of second regions 26 are uniformly distributed in the optoelectronic semiconductor chip 20. In this regard, the second regions 26 are arranged at nodes of a square lattice. The second regions 26 comprise a circular cross section in top view. The second regions 26 are each arranged at the center of a diagonal line between two penetrations 27.

In FIG. 8B, a top view of another exemplary embodiment of the semiconductor optoelectronic chip 20 is shown. This exemplary embodiment is also the exemplary embodiment shown in FIG. 6. Unlike the exemplary embodiment shown in FIG. 8A, the second regions 26 comprise a square lattice shape. Overall, a symmetrical shape or arrangement of the second regions 26 is advantageous, for example a hexagonal or rectilinear shape.

In FIG. 9, a schematic cross-sectional view of another exemplary embodiment of the optoelectronic semiconductor chip 20 is shown. Compared with the exemplary embodiment shown in FIG. 1, the optoelectronic semiconductor chip 20 is shown to comprise a carrier 41. The electrically conductive material 44 of the penetration 27 extends over the entire extension of the optoelectronic semiconductor chip 20. The insulation region 34 is arranged between the electrically conductive material 44 and the x-side contact 37. The carrier 41 is connected to the electrically conductive material 44 by a connecting material 46. In the right view in FIG. 9, it is also shown that in the left view in FIG. 9, a section of the optoelectronic semiconductor chip 20 is shown. At the radiation exit side 30, the optoelectronic semiconductor chip 20 comprises a first electrical contact 42. At the side of the carrier 41 facing away from the radiation exit side 30, the optoelectronic semiconductor chip 20 comprises a second electrical contact 43. Alternatively, the first and second electrical contacts 42, 43 may both be arranged on the radiation exit side 30 or on the side of the carrier 41 facing away from the radiation exit side 30.

The invention is not limited to the exemplary embodiments by the description thereof. Rather, the invention encompasses any new feature as well as any combination of features, which particularly includes any combination of features in the patent claims, even if that feature or combination itself is not explicitly specified in the patent claims or exemplary embodiments.

This patent application claims the priority of German patent application 102018127201.4, the disclosure content of which is hereby incorporated by reference.

LIST OF REFERENCE SIGNS

20: optoelectronic semiconductor chip
21: x-doped region
22: y-doped region

23: active region
24: x-contact region
25: first region
26: second region
27: penetration
28: electrically insulating layer
29: electrically conductive layer
30: radiation exit side
31: x-contact layer
32: diffusion layer
33: cover layer
34: insulation region
35: y-contact layer
36: surface
37: x-side contact
38: photoresist
39: mask
40: substrate
41: carrier
42: first electrical contact
43: second electrical contact
44: electrically conductive material
45: side wall
46: connecting material
x: lateral direction
z: vertical direction

The invention claimed is:

1. An optoelectronic semiconductor chip comprising:
an x-doped region;
a y-doped region;
an active region arranged between the x-doped region and the y-doped region; and
an x-contact region;
wherein:
the x-contact region is arranged on the side of the x-doped region facing away from the active region;
the x-contact region comprises at least one first region and at least one second region;
the x-contact region is designed such that, during operation of the optoelectronic semiconductor chip, more charge carriers are injected into the x-doped region via the second region than via the first region;
the first region comprises a first electrical conductivity and the second region comprises a second electrical conductivity, wherein the first electrical conductivity is at least 0.1 percent of the second electrical conductivity;
wherein the x-contact region comprises a plurality of first regions and a plurality of second regions.

2. The optoelectronic semiconductor chip according to claim 1, wherein the first electrical conductivity is at most 20 percent of the second electrical conductivity.

3. The optoelectronic semiconductor chip according to claim 1, wherein the first and the second regions comprise the same material.

4. The optoelectronic semiconductor chip according to claim 1, wherein the first and the second regions are arranged adjacent in a lateral direction, wherein the lateral direction is parallel to the main extension plane of the optoelectronic semiconductor chip.

5. The optoelectronic semiconductor chip according to claim 1, further comprising a penetration, wherein the penetration extends through the x-doped region and the active region for electrically contacting the y-doped region.

6. The optoelectronic semiconductor chip according to claim 5, wherein the size of the second regions in a lateral direction is greater the further away the second regions are from the penetration, wherein the lateral direction runs parallel to the main extension plane of the optoelectronic semiconductor chip.

7. The optoelectronic semiconductor chip according to claim 1, wherein the first region comprises a disturbed crystal structure.

8. The optoelectronic semiconductor chip according to claim 1, wherein the first region comprises an electrically insulating layer.

9. The optoelectronic semiconductor chip according to claim 1, wherein the first and the second regions comprise an electrically conductive layer having a third electrical conductivity, wherein the third electrical conductivity is greater than an electrical conductivity of the y-doped region.

10. The optoelectronic semiconductor chip according to claim 1, wherein a radiation exit side of the optoelectronic semiconductor chip is arranged on the side of the y-doped region facing away from the active region.

11. A method for producing an optoelectronic semiconductor chip; wherein the method comprises:
applying an x-doped region to a y-doped region to form an active region between the x-doped region and the y-doped region; and
applying an x-contact region to the x-doped region;
wherein:
the x-contact region comprises at least one first region and at least one second region; and
the x-contact region is designed such that, during operation of the optoelectronic semiconductor chip, more charge carriers are injected into the x-doped region via the second region than via the first region.

12. A method according to claim 11, further comprising treating the first region with a plasma.

13. A method according to claim 11, further comprising applying an electrically insulating layer to the x-doped region in the first region.

14. A method according to claim 11, further comprising applying an electrically conductive x-contact layer to the first and the second region.

15. A method according to claim 11, further comprising applying an electrically conductive x-contact layer to the x-doped region prior to applying the x-contact region.

16. A method according to claim 15, in further comprising:
applying a conductive layer to the x-contact layer in the first region; and
applying a diffusion layer to the electrically conductive layer and the x-contact layer; wherein the diffusion layer comprises an oxide.

17. A method according to claim 16, further comprising:
removing the diffusion layer; and
applying a cover layer to the electrically conductive layer and the x-contact layer.

18. An optoelectronic semiconductor chip comprising:
an x-doped region;
a y-doped region;
an active region arranged between the x-doped region and the y-doped region; and
an x-contact region;
wherein:
the x-contact region is arranged on the side of the x-doped region facing away from the active region;
the x-contact region comprises at least one first region and at least one second region;
the x-contact region is designed such that, during operation of the optoelectronic semiconductor chip, more charge carriers are injected into the x-doped region via the second region than via the first region;

the first region comprises a first electrical conductivity and the second region comprises a second electrical conductivity, wherein the first electrical conductivity is at least 0.1 percent of the second electrical conductivity; and wherein the first region comprises one of the following: a disturbed crystal structure or an electrically insulating layer.

19. The optoelectronic semiconductor chip according to claim 18, wherein the x-contact region comprises a plurality of first regions and a plurality of second regions.

* * * * *